(12) United States Patent  
Sofia et al.

(10) Patent No.: US 9,389,989 B2  
(45) Date of Patent: Jul. 12, 2016

(54) SELF VERIFYING DEVICE DRIVER FOR MULTI-VERSION COMPATIBLE DATA MANIPULATION DEVICES

(71) Applicant: International Business Machines Corporation, Armonk, NY (US)

(72) Inventors: Anthony T. Sofia, Highland, NY (US); Brad D. Stilwell, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 169 days.

(21) Appl. No.: 14/219,347

(22) Filed: Mar. 19, 2014

(65) Prior Publication Data

US 2015/0269056 A1      Sep. 24, 2015

(51) Int. Cl.  
    *G06F 11/36* (2006.01)  
    *G06F 17/50* (2006.01)

(52) U.S. Cl.  
    CPC .......... *G06F 11/368* (2013.01); *G06F 11/3688* (2013.01); *G06F 11/3692* (2013.01); *G06F 11/3696* (2013.01); *G06F 17/5009* (2013.01)

(58) Field of Classification Search  
    CPC .............. G06F 11/3668; G06F 11/368; G06F 11/3696; G06F 11/261  
    See application file for complete search history.

(56) References Cited

U.S. PATENT DOCUMENTS

| | | | |
|---|---|---|---|
| 5,301,312 A | | 4/1994 | Christopher, Jr. et al. |
| 5,557,740 A | * | 9/1996 | Johnson .............. G06F 11/3688 714/38.1 |
| 5,717,903 A | * | 2/1998 | Bonola .................. G06F 13/105 703/24 |
| 6,243,833 B1 | * | 6/2001 | Hitchcock ........... G06F 11/2215 714/33 |
| 8,255,880 B2 | | 8/2012 | DeWitt, Jr. et al. |
| 8,776,026 B2 | | 7/2014 | Candea et al. |
| 2004/0030809 A1 | | 2/2004 | Lozano et al. |
| 2011/0307739 A1 | * | 12/2011 | El Mahdy ............. G06F 11/261 714/28 |
| 2013/0085720 A1 | | 4/2013 | Xie et al. |

OTHER PUBLICATIONS

IBM; "Method and Apparatus for Distributed Open Systems Device Drivers Functional Verification Test"; An IP.com Prior Art Database Technical Disclosure; http://ip.com/IPCOM/000019251D; Sep. 8, 2003, pp. 1-4.

(Continued)

*Primary Examiner* — Joseph Schell  
(74) *Attorney, Agent, or Firm* — Cantor Colburn LLP; William A. Kinnaman, Jr.

(57) ABSTRACT

A method, system, and computer program product are described. The method of testing a device driver includes executing a test case for the device driver, the device driver receiving version information specifying a targeted version of a data manipulation device to be targeted by the device driver from the test case or the device driver determining the targeted version of the data manipulation device independently of the test case. The method also includes verifying whether a version of the data manipulation device specified in a request from the device driver is a match or a non-match with the targeted version of the data manipulation device. The method further includes simulating the data manipulation device to provide output to the device driver based on the verifying, the simulating the data manipulation device being unchanged for every version of the data manipulation device.

6 Claims, 3 Drawing Sheets

(56) References Cited

OTHER PUBLICATIONS

IBM; "Methodology to Exchange Real Device Access by Device Simulation in Embedded Systems"; An IP.com Prior Art Database Technical Disclosure; http//ip.com/IPCOM/000018954D; Aug. 22, 2003, pp. 1-5.

* cited by examiner

SELF VERIFYING DEVICE DRIVER FOR MULTI-VERSION COMPATIBLE DATA MANIPULATION DEVICES

BACKGROUND

The present invention relates to a hardware device simulation and device driver, and more specifically, to a self-verifying device driver for multi-version compatible data manipulation devices.

A data manipulation device is a hardware based product (e.g., microprocessor). Over the life cycle of the product, multiple different versions of the same physical device may be produced with upgrades or modifications. The underlying data manipulation remains in the same format for every version (backwards and forward compatible) even though different characteristics and options may exist among the versions. The device driver is a computer program that controls the data manipulation device. That is, the device driver provides a software interface to the data manipulation device and is used to issue commands to the data manipulation device to obtain output. The device driver maintains information regarding a pool of data manipulation devices and this pool can have data manipulation devices of multiple versions. The device driver is tested by executing test cases that issue commands to the device driver which in turn builds requests that are presented to the data manipulation device, implemented in hardware or as a simulation. The commands to the device driver from the test case may or may not specify a specific device version which must be used. When there is no device version specified, the device driver may choose any data manipulation device and build a command block for that version. When the device driver is coupled to a particular data manipulation device that it will send requests to, the device driver determines the version of that data manipulation device through a handshake or interrogation process.

SUMMARY

According to one embodiment of the present invention, a computer-implemented method of testing a device driver includes executing, using a processor, a test case for the device driver, the device driver receiving version information specifying a targeted version of a data manipulation device to be targeted by the device driver from the test case or the device driver determining the targeted version of the data manipulation device independently of the test case; verifying whether a version of the data manipulation device specified in a request from the device driver is a match or a non-match with the targeted version of the data manipulation device; and simulating the data manipulation device to provide output to the device driver based on the verifying, the simulating the data manipulation device being unchanged for every version of the data manipulation device.

According to another embodiment, a system to test a device driver includes a first memory device configured to store programming code of the device driver, the device driver providing an interface to a data manipulation device; a second memory device configured to store a test case to test the device driver, the device driver receiving version information specifying a targeted version of the data manipulation device to be targeted by the device driver from the test case or the device driver determining the targeted version of the data manipulation device independently of the test case; a third memory device configured to store a simulation including a version verification portion and a data manipulation portion, the data manipulation portion remaining unchanged for every version of the data manipulation device; and a processor configured to execute the test case on the device driver, execution of the test case being configured to include, based on a request by the device driver, execution of the version verification portion of the simulation and, based on a result of executing the version verification portion, execution of the data manipulation portion of the simulation.

According to yet another embodiment, a non-transitory computer program product stores instructions which, when executed by a processor, cause the processor to implement a method of verifying a version of a data manipulation device in a request by a device driver under test. The method includes determining whether the version of the data manipulation device in the request is a match or a non-match with a targeted version of the data manipulation device, the targeted version being either specified in a test case being executed by the device driver or determined independently of the test case; and calling a data manipulation simulation based on the determining, the data manipulation simulation being unchanged for every version of the data manipulation device in the request.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, a device driver is a software program that controls a hardware based data manipulation device. The device driver is tested with test cases that specify parameters to the device driver which build requests to be passed to the data manipulation device. The data manipulation device can either be a software simulation, as referenced in this document, or an actual hardware device. The simulation is likely based on the initial data manipulation device version, but newer data manipulation device versions may require a slightly different request structure. While the device driver must be tested to ensure that it is sending the correct request based on the specified version of the data manipulation device, modifying or adding simulations for every version of the data manipulation device may be undesirable. It may also be undesirable to rework an existing body of test cases.

Embodiments of the systems and methods detailed herein relate to a verification layer between the device driver and the data manipulation implemented in a simulation of a data manipulation device. Because the verification layer separately verifies requests from the device driver with regard to version-specific characteristics, the verification layer facilitates maintaining the core simulation of the data manipulation device. Further, because of the handshake or interrogation procedure of the device driver with the data manipulation device (or simulation) that facilitates the device driver determining the version to address in subsequent requests, the regression test suite may also remain unchanged for every version of the data manipulation device. That is, for newer version of a data manipulation device, the test case would simply not specify a version at all.

Figure 1:
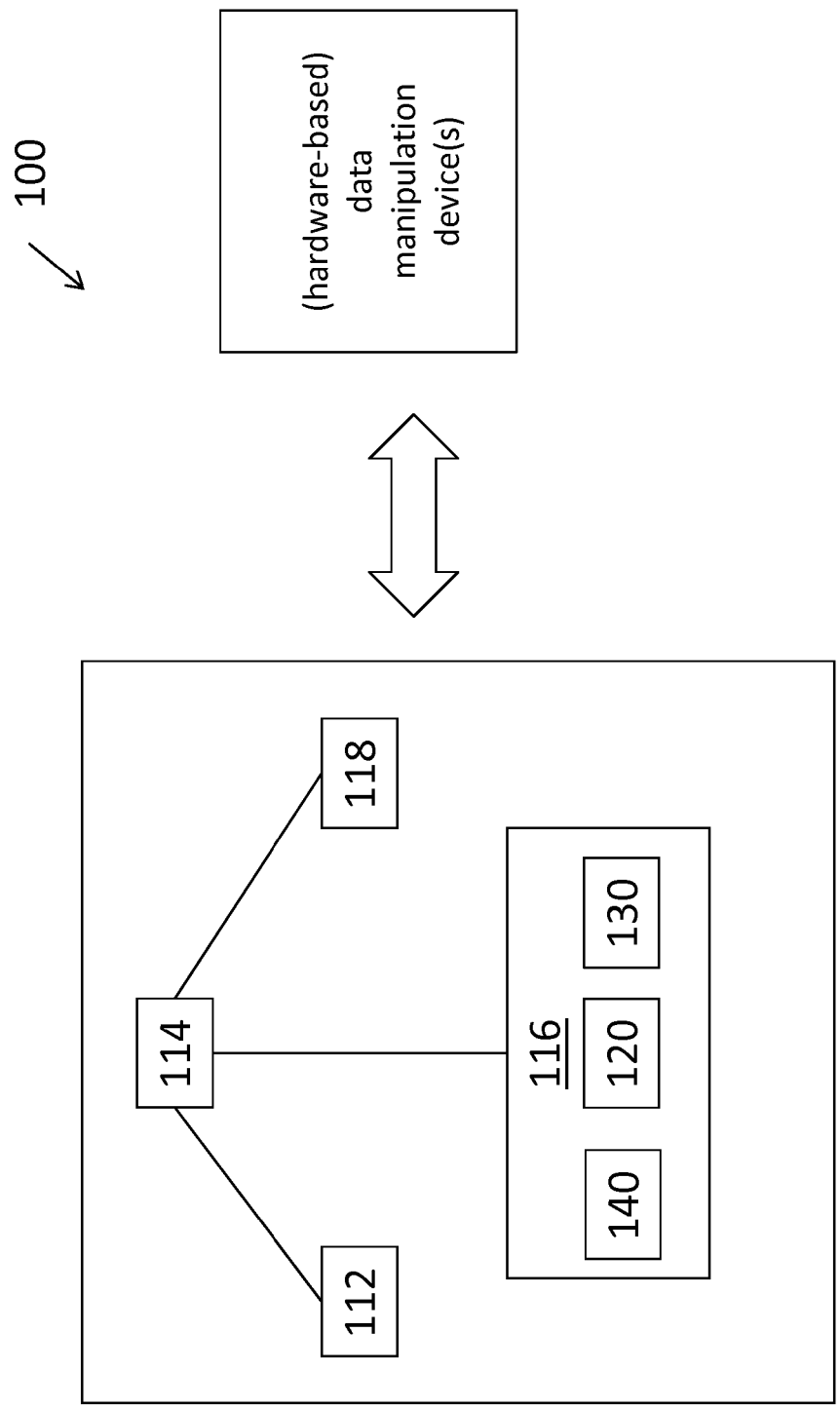
FIG. 1 is a block diagram of a system that tests the device driver according to an embodiment of the invention.

FIG. 1 is a block diagram of a system 100 (add to FIG. 1) that tests a device driver 120 according to an embodiment of the invention. The system 100 (e.g., a computer system) includes an input interface 112, one or more processors 114, one or more memory devices 116, and an output interface 118. The memory device 116 may store the device driver 120 (programming code), the simulation 130 of the data manipulation device according to embodiments of the invention, and the test cases 140. In alternate embodiments, one or more of the device driver 120, the simulation 130, and the test cases 140 may be stored in a memory device other than the memory device 116 that is accessible through the input interface 112, for example. As shown, the system 100 running the device driver 120 programming code may be coupled to one or more hardware-based data manipulation devices. After successful testing, the device driver 120 may be used with a data manipulation device of any known version. The processor 114 processes the programming code of the device driver 120 for the various test cases 140. The test cases 140 executed by the device driver 120 are verified using the simulation 130. As further detailed below, the simulation 130 according to embodiments of the invention includes two portions or layers. In addition to the common simulation portion (core data manipulation) that is common to all versions of the data manipulation device, another portion (layer) is added to the simulation 130 to verify the request from the device driver 120.

Figure 2:
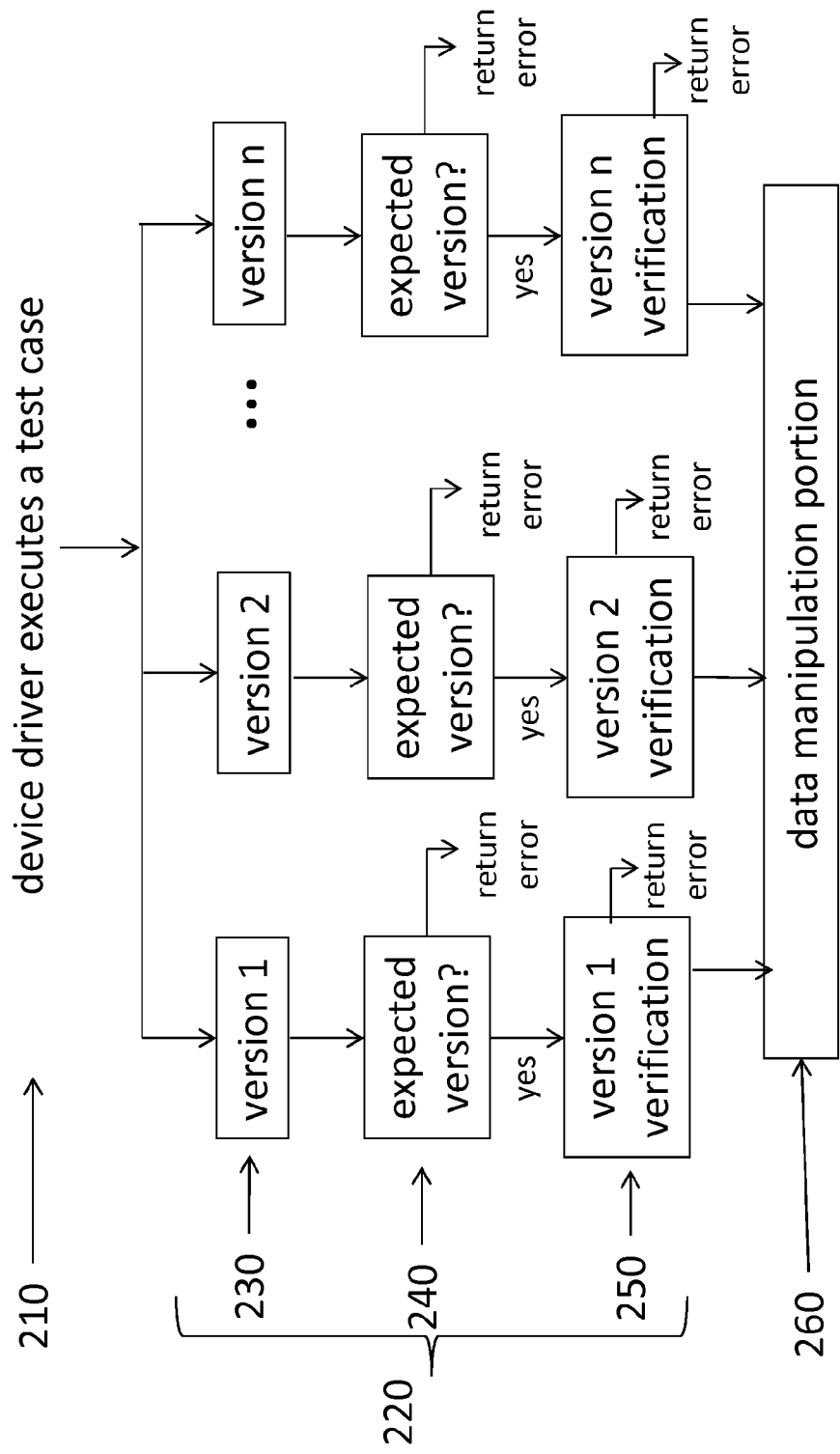
FIG. 2 is a functional flow diagram of the simulation according to embodiments of the invention.

FIG. 2 is a functional flow diagram of the simulation 130 according to embodiments of the invention. The flow begins when the device driver 120 executes a test case 140 (210). As noted above, the test case 140 itself may specify a version of the data manipulation device for the device driver 120 to target. Alternately, the version may be determined by the device driver 120 independently of the test case 140. That is, the test case 140 may not specify a version so that the device driver 120 can determine a (newer) version based on initial communication with the simulation 130. The functional flow is separated into the version verification portion 220 and the data manipulation portion 260. In the version verification portion 220, a function 230 includes determining the version specified by the device driver 120 in its request. Another function 240 in the version verification portion 220 is determining whether the version specified in the request is the version that is expected. The version verification portion 220 of the simulation 130 knows both the version specified by the device driver 120 and the version that should have been specified by the device driver 120 in the following ways. The version verification portion 220 uses the following information: device information (handle for a specific version of the data manipulation device) per device driver 120 input/output; software token setup for each input/output that contains information about device driver 120 decisions and user request parameters (that led to those decisions); and the input/output request with associated input/output memory. This information used by the verification portion 220 is independent of whether the test case 140 specified the version or not. Using this information, the version verification portion 220 accesses the internal memory of the device driver 120 and indexes the internal memory with the information to determine the version of the data manipulation device and other characteristics known to the device driver 120. The software token contains indicators of how the decisions were made about the request being built by the device driver 120. That is, the software token provides the information about the correct version of the data manipulation device and the internal memory provides information in the device driver 120 regarding that version. The correct version information (from the software token and internal memory) may be cross validated with the version (request values) set up by the device driver 120 (determined as part of function 230) based on the input/output request information that the version verification portion 220 also uses. This cross validation facilitates the execution of the functions of determining whether the version is the expected version (240).

The execution of the function (240) to check the specified version versus the expected version results in the simulation 130 version verification portion 220 returning an error, discussed further below, to the device driver 120 when the version of the data manipulation device specified in the request from the device driver 120 does not match the version that was supposed to be specified based on the test case 140 being executed or the initial communication. When the version of the data manipulation device specified in the request from the device driver 120 does match the version that was supposed to be specified, the version-specific characteristics of the request are verified as part of the function 250. The version-specific characteristics include, for example, the formatting of the request. When the version-specific characteristics are verified, the data manipulation portion 260 of the simulation 130 is executed. Regardless of the version of the data manipulation device, specified by the test case 140 or the initial communication, and the request from the device driver 120, the data manipulation portion 260 of the simulation 130 is the same. When a new version of the data manipulation device is added, the new version is added to the version verification portion 220 in order to test the device driver 120 functionality with regard to the new version, but the data manipulation portion 260 (and initiating test case 140) remains unchanged.

When the version-specific characteristics are not verified as part of function 250, an error is returned. Thus, whether the wrong version of the data manipulation device is specified by the device driver 120 or the wrong request characteristics targeting the correct version are included in the request by the device driver 120, an error is output, and the simulation 130 is interrupted. The format of the error may be a hardware specific error code or a software specific error code. The error codes may fit into the existing structure (i.e., match error codes already set up for the existing data manipulation portion 260 of the simulation 130) such that additional changes are not required for the test case 140 targeting a specific (new) version of the data manipulation device. The error code may indicate a specific verification step of the simulation 130 (e.g., the expected version verification (function 240), version characteristic verification (function 250)) that failed.

Figure 3:
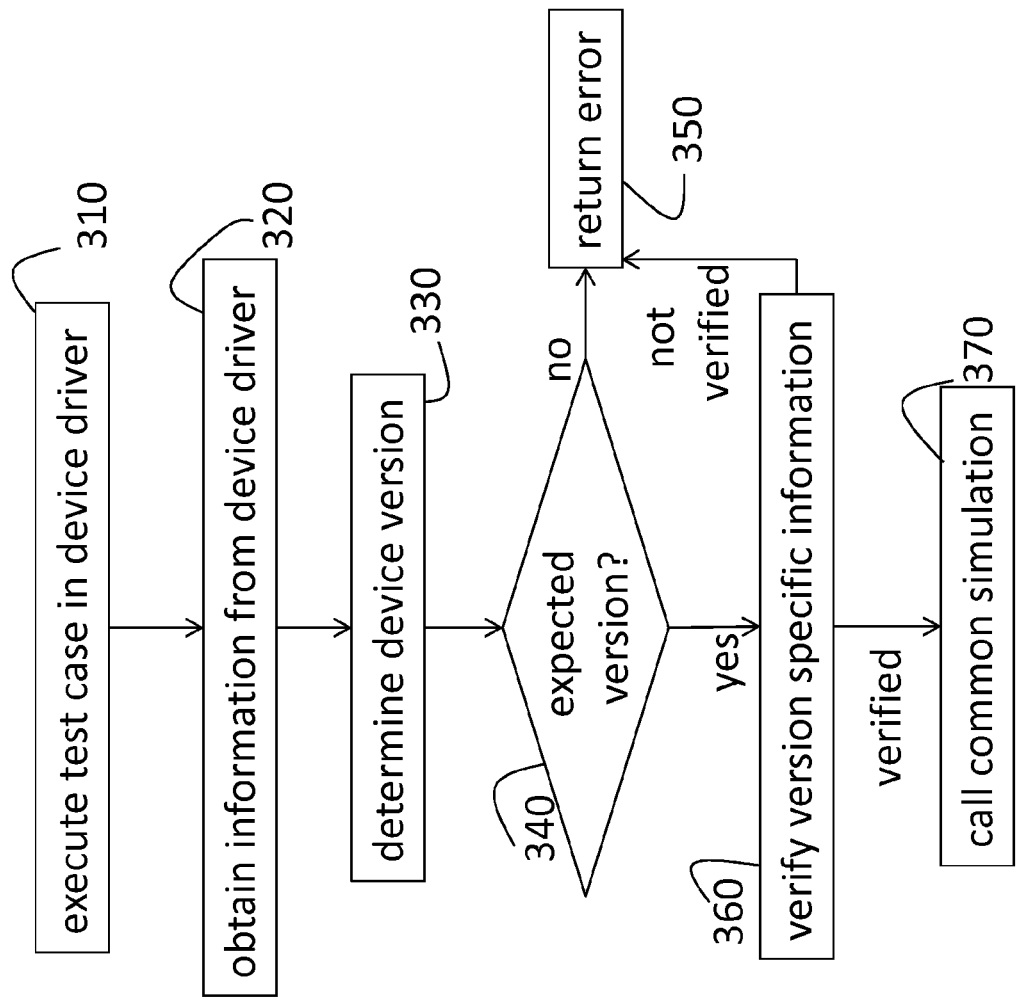
FIG. 3 is a process flow of a method of verifying the device driver request according to embodiments of the invention.

FIG. 3 is a process flow of a method of verifying the device driver 120 request according to embodiments of the invention. At block 310, executing a test case 140 in the device driver 120 includes the device driver 120 being provided with information about the version of the data manipulation device to target. The version may be specified by the test case 140 itself or through initial communication between the device driver 120 and the simulation 140 (version verification portion 220). At block 320, obtaining information related to the device driver 120 includes obtaining information from the software token and the internal memory of the device driver 120 as well as information in the request generated by the device driver 120, as discussed with reference to functions of the version verification portion 220 above. Determining the device version, at block 330, refers to the version specified in the request generated by the device driver 120 and is done as detailed with reference to function 230 above. At block 340, the simulation 130 (version verification portion 220 of the simulation 130) determines if the version of the data manipulation device specified by the device driver 120 is the expected version of the data manipulation device. This process is executed using the cross verification discussed above with reference to function 240. When it is determined (block 340) that the correct version of the data manipulation device is being targeted by the device driver 120 under test, verifying version-specific information at block 360 is performed by the version verification portion 220 of the simulator 130. As noted above, the verification may include verifying formatting, for example. When the version specific information is verified, the version verification portion 220 of the simulation 130 calling the common simulation 130 (block 370) includes the version verification portion 220 initiating the data manipulation portion 260 of the simulation 130. As noted above, the data manipulation portion 260 of the simulation 130 remains unchanged for the different versions for which the device driver 120 is tested.

When either the expected version of the data manipulation device is not requested by the device driver 120 (block 340) or the version-specific information in the request is not verified (block 360), returning an error message, at block 350, can include the hardware specific or software specific codes discussed above. As an example, the hardware specific error codes might follow the format 0x0000zzzz, where zzzz represents the hardware error code. The software specific errors may be represented with 0xFFFFzzzz so that the hardware codes are distinguished from the software codes but fit within the same structure. Even in the event that existing test cases are not updated to recognize these new codes, the fact that the error codes fit into the existing structure allows the test case to still generically detect an error and perform general diagnostics.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method of testing a device driver, the method comprising:
    executing, using a processor, a test case for the device driver, the device driver receiving version information specifying a targeted version of a data manipulation device to be targeted by the device driver from the test case or the device driver determining the targeted version of the data manipulation device independently of the test case;
    verifying whether a version of the data manipulation device specified in a request from the device driver is a match or a non-match with the targeted version of the data manipulation device; and
    simulating the data manipulation device to provide output to the device driver based on the verifying.

2. The method according to claim 1, further comprising determining whether version-specific information in the request is correct or incorrect when the verifying indicates the match, wherein the simulating is performed when the verifying indicates the match and the determining indicates that the version-specific information is correct.

3. The method according to claim 2, wherein the version-specific information includes a format of the request.

4. The method according to claim 2, further comprising issuing an error code when the verifying indicates the non-match or when the determining indicates that the version-specific information is incorrect.

5. The method according to claim 4, wherein the issuing the error code includes issuing a hardware specific error code and a software specific error code, the hardware specific error code and the software specific error code including a same structure.

6. The method according to claim 4, wherein the issuing the error code includes indicating whether the verifying indicates a non-match or the determining indicates that the version-specific information is not correct based on the error code.

* * * * *